United States Patent
Subramanian et al.

(10) Patent No.: US 7,262,422 B2
(45) Date of Patent: Aug. 28, 2007

(54) USE OF SUPERCRITICAL FLUID TO DRY WAFER AND CLEAN LENS IN IMMERSION LITHOGRAPHY

(75) Inventors: Ramkumar Subramanian, Sunnyvale, CA (US); Bhanwar Singh, Morgan Hill, CA (US); Khoi A. Phan, San Jose, CA (US)

(73) Assignees: Spansion LLC, Sunnyvale, CA (US); Advanced Micro Devices, Inc., Austin, TX (US)

( * ) Notice: Subject to any disclaimer, the term of this patent is extended or adjusted under 35 U.S.C. 154(b) by 290 days.

(21) Appl. No.: 11/173,257

(22) Filed: Jul. 1, 2005

(65) Prior Publication Data
US 2007/0026345 A1    Feb. 1, 2007

(51) Int. Cl.
*G03C 5/00* (2006.01)

(52) U.S. Cl. .................. 250/492.2; 359/642; 430/311; 430/395; 430/313

(58) Field of Classification Search ...................... None
See application file for complete search history.

(56) References Cited

U.S. PATENT DOCUMENTS

| | | | |
|---|---|---|---|
| 5,879,866 | A | 3/1999 | Starikov et al. |
| 5,900,354 | A | 5/1999 | Batchelder |
| 6,309,809 | B1 | 10/2001 | Starikov et al. |
| 2002/0163629 | A1 | 11/2002 | Switkes et al. |
| 2003/0123040 | A1 | 7/2003 | Almogy |
| 2003/0174408 | A1 | 9/2003 | Rostalski et al. |

OTHER PUBLICATIONS

International Search Report for PCT/US2006/024765 dated Jan. 16, 2007.

*Primary Examiner*—Jack I. Berman
*Assistant Examiner*—Zia R. Hashmi
(74) *Attorney, Agent, or Firm*—Amin, Turocy & Calvin, LLP

(57) ABSTRACT

Disclosed are immersion lithography methods and systems involving irradiating a photoresist through a lens and an immersion liquid of an immersion lithography tool, the immersion liquid in an immersion space contacting the lens and the photoresist; removing the immersion liquid from the immersion space; charging the immersion space with a supercritical fluid; removing the supercritical fluid from the immersion space; and charging the immersion space with immersion liquid.

20 Claims, 5 Drawing Sheets

USE OF SUPERCRITICAL FLUID TO DRY WAFER AND CLEAN LENS IN IMMERSION LITHOGRAPHY

TECHNICAL FIELD

The subject invention generally relates to improving immersion lithography. More particularly, the subject invention relates to using supercritical fluids to clean immersion lithography lenses and wafers undergoing immersion lithography processing.

BACKGROUND ART

Conventional photolithography involves projecting actinic radiation onto a photoresist clad wafer. The physical limit to the numerical aperture (NA) for such exposure systems using air as a medium between a lens and the wafer is 1. NA is actually determined by the acceptance angle of the lens and the index of refraction of the medium surrounding the lens. Microscopy has for some time employed oil for resolution enhancement.

Immersion technology offers improved resolution enhancement and higher numerical apertures over conventional projection lithography. In immersion lithography, the space between the projection lens and the wafer in a tool is filled with a liquid. Tat is, immersion lithography uses a thin layer of liquid to further focus resolution. However, immersion lithography typically requires large, expensive lenses.

While the immersion is promising, there are a number of concerns associated with implementing immersion lithography that require resolution in order for the technology to gain wide acceptance. For example, there is a tendency for the liquid in immersion lithography to develop annoying micro-bubbles, which ruins the benefits offered by the technology. Maintaining a consistent bubble free liquid between the lens and the wafer is very difficult. Polarization of the lens is also a significant concern.

Water is the most common liquid employed in current immersion lithography systems. This is because water has an index of refraction of about 1.47, an absorption of less than about 5% at working distances of up to 6 mm, is compatible with most photoresists and lens, and in an ultrapure form, is non-contaminating. Specifically, the liquid employed for most immersion applications is double deionized, distilled, degassed water. Nevertheless, improvements in immersion lithography are desired.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention generally relates to readily replacing the immersion liquid of an immersion lithography tool with a supercritical fluid to clean portions of the immersion lithography tool, such as one or more of the lens, the immersion space, the immersion liquid, and the photoresist or wafer surface. Equipped with a valve system or the like, the supercritical fluid can be readily replaced with the immersion liquid (recycled or fresh) so that further immersion lithography processing can be conducted. The systems and methods mitigate down time for cleaning thereby improving the efficiency of immersion lithography.

One aspect of the subject invention relates to immersion lithography methods involving irradiating a photoresist through a lens and an immersion liquid of an immersion lithography tool, the immersion liquid in an immersion space contacting the lens and the photoresist; removing the immersion liquid from the immersion space; charging the immersion space with a supercritical fluid; removing the supercritical fluid from the immersion space; and charging the immersion space with immersion liquid. The related automated methods may be facilitated by using monitors, sensors, controllers, processors, and related devices.

Another aspect of the subject invention relates to immersion lithography systems that contain a source of actinic radiation, a lens, an immersion liquid, and an immersion space for holding the immersion liquid in contact with the lens and in contact with a photoresist positioned on a wafer; a source of a supercritical fluid; and a valve system operable to remove the immersion liquid from the immersion space and fill the immersion space with the supercritical fluid and operable to remove the supercritical fluid from the immersion space and fill the immersion space with the immersion liquid. The systems may be facilitated by further using monitors, sensors, controllers, processors, and related devices.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

The inventors have observed that photoresist species may diffuse into an immersion liquid during immersion lithography operations. The diffused photoresist species and/or other contaminants in the immersion liquid may be attracted to the lens (in the same or subsequent lithographic operations) preventing some of the actinic radiation from irradiating the photoresist, thereby causing poor pattern formation in the developed photoresist. Moreover, the inventors have observed that the immersion liquid may cause undesirable staining of and/or leave a residue on the wafer.

Figure 1:
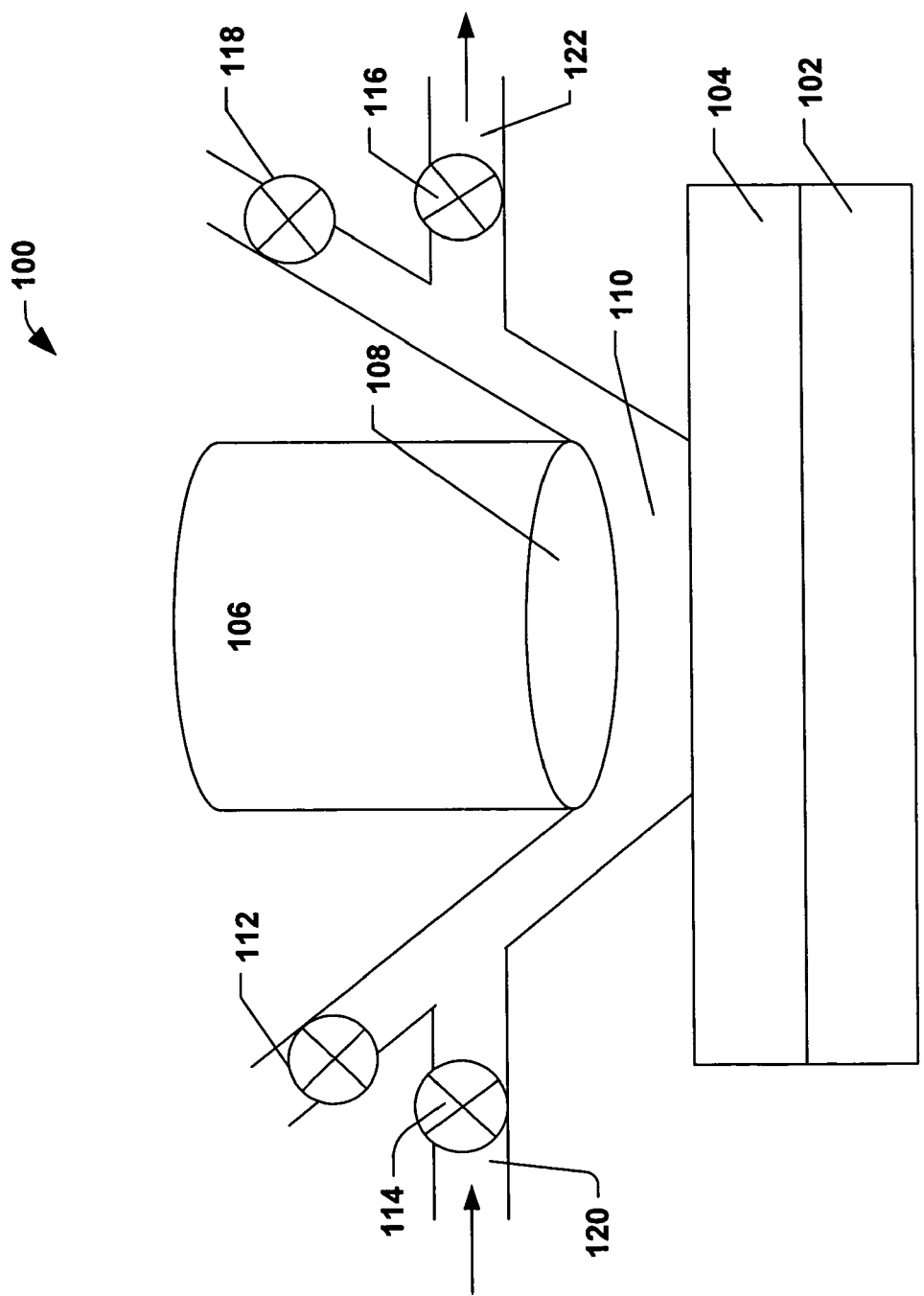
FIG. 1 is a schematic illustration of an immersion lithography system in accordance with one aspect of the subject invention.

The subject invention involves contacting a lens, a portion of the space occupied by the immersion liquid, and wafer used in an immersion lithography operation with a supercritical fluid. The low surface tension of the supercritical fluid functions to facilitate removal of contaminants that are present on the lens, in the space occupied by the immersion liquid, and from the wafer. An immersion lithography system is provided with suitable valves and a supercritical fluid source so that the supercritical fluid can flushed through the pertinent portions of the immersion lithography system to clean at least one of the lens, the space occupied by the immersion liquid, the immersion liquid, and wafer Referring to FIG. 1, a system 100 and method according to one aspect of the subject invention are described. The system 100 includes an immersion lithography tool 106 such as a stepper and a lens 108. The immersion lithography tool contains an actinic radiation source and power supply (not shown). A wafer 102 with a photoresist 104 formed thereon is positioned below the immersion lithography tool 106. An immersion liquid occupies space 110 between the lens 108 and the photoresist 104 of the wafer 102. Actinic radiation is directed through the lens 108 and through the immersion liquid to make an image-wise pattern on the photoresist 104. After development, the photoresist has a structural pattern analogous to the image-wise pattern of radiation (or a negative thereof).

Immersion liquids are typically substantially transparent at one or more wavelengths or wavelength bands used as actinic radiation. The immersion liquid does not degrade with exposure to radiation, e.g., the liquid does not become increasingly opaque with increasing exposure. The immersion liquid typically provides low or substantially zero scattering of light projected through the liquid. The immersion liquid fills a space between the lens and the photoresist. The immersion liquid is in contact with at least a portion of the lens and at least a portion of a surface of the photoresist, and continuously fills a space between the lens surface and photoresist. The immersion liquid preferably does not substantially interact with the photoresist in a manner that impedes image-wise exposure or subsequent pattern formation. For example, photoresist is not soluble in the immersion liquid, and the immersion liquid does not chemically react with the photoresist.

Examples of immersion liquids suitable for use with this invention include purified water; deionized water; double deionized water; ionized water such as water containing phosphates, and water containing sulfates; cyclo-octane; perfluoropolyethers (PFPE); and the like. The identity of the immersion liquid is not critical to the subject invention.

PFPEs are available under the trademarks Fomblin Y®, Fomblin Z®, Demnum™ which are available from the Ausimont Corporation of Thorofare, N.J. and/or from Daikin Corporation of Osaka, Japan; Krytox® available from Dupont Corporation of Wilmington, Del.; and Galden® available from the Ausimont Corporation. Fomblin Y®, Fomblin Z®, Demnum™ have molecular weight ranges from about 1,500 to about 7,250 AMUs (e.g., Fomblin®Y-18); from about 4,000 to about 19,000 AMUs (e.g., Fomblin Z®Z-25); and from about 2,700 to about 8,400 AMUs (e.g., Demnum™S20 and Demnum™S200).

Any known wavelength may be employed in the present invention. Typically, the wavelength is about 400 nm or less. Examples of wavelengths suitable for use with this invention include 365 nm, 248 nm, 193 nm, 157 nm, 13 nm, 11 nm, and the like. The identity of the wavelength of the actinic radiation is not critical to the subject invention.

The photoesists suitable for use with the subject invention have appropriate photosensitivity at the selected wavelength of actinic radiation. Any known photoresist may be employed. The photoesist can be positive or negative. The identity of the photoresist is not critical to the subject invention.

The stepper or lithography tool is specifically made for immersion lithography or can be made by re-designing or converting a conventional "dry" (i.e., non-immersion) lithographic tool for use as an immersion lithographic system. For example, projection systems and wafer handling portions of conventional lithographic systems may be modified to accommodate an immersion liquid.

The flow of immersion liquid is carried out using valves 112 and 118. When desired, a supercritical fluid may be flushed through the system 100 through inlet 120 and valve 114, occupy the space 110 between the lens 108 and the photoresist 104 of the wafer 102, and out through valve 116 and outlet 122 (following the arrows).

After a certain number of immersion lithography operations, contamination begins to accumulate on the lens 108, in the space 110 between the lens 108 and the photoresist 104, and on the photoresist 104 of the wafer 102 due to photoresist species that diffuse into the immersion liquid as well as due to the undesirable presence of other debris. Since the contamination may physically adhere to the lens 108, surfaces of the space 110 between the lens 108 and the photoresist 104, and on the photoresist 104, changing the immersion liquid or maintaining open flow between valves 112 and 118 may not sufficient to clean the lens 108, surfaces of the space 110, and/or the photoresist 104.

Consequently, the immersion liquid is removed from space 110 and valves 112 and 118 are closed. Valve 114 is opened permitting a supercritical fluid to enter the inlet 120 and fill the space 110 between the lens 108 and the photoresist 104. Valve 116 may be immediately opened, or opened after a set period of time allowing for specified contact between the supercritical fluid and the lens 108, surfaces of the space 110, and/or the photoresist 104. The supercritical fluid may be obtained from a supercritical fluid source such as a supercritical fluid chamber (not shown). When the lens 108, surfaces of the space 110, and/or the photoresist 104 are contacted with the supercritical fluid, the supercritical fluid substantially removes or completely removes the contamination and debris that adheres to the lens 108, surfaces of the space 110, and/or the photoresist 104. After cleaning, valves 114 and 116 are closed, valves 112 and 118 are opened, and fresh immersion liquid flows into space 110 so that additional immersion lithography operations can be conducted.

Describing the action of the subject invention more thoroughly, the lens, the space between the lens and the photoresist (the immersion space) of the lithography tool and the wafer surface are contacted with a supercritical fluid. The supercritical fluid displaces defects, debris, and other unwanted material from the lens, the immersion space, and the wafer surface as the supercritical fluid is substantially removed from the lens, the immersion space, and the wafer surface and exits the immersion lithography tool. To accommodate the supercritical fluid, the immersion space is made of materials that can tolerate high pressures.

A supercritical fluid is a fluid medium that is at a temperature that is sufficiently high that it cannot be liquified by pressure. A supercritical fluid relates to dense gas solutions with enhanced solvation powers, and can include near supercritical fluids. The basis for a supercritical fluid is that at a critical temperature and pressure, the liquid and gas phases of a single substance can co-exist.

The supercritical fluid phenomenon is documented, see pages F-62 to F-64 of the CRC Handbook of Chemistry and Physics, 67th Edition, 1986-1987, published by the CRC Press, Inc., Boca Raton, Fla. At high pressures above the critical point, the resulting supercritical fluid, or "dense gas", attains densities approaching those of a liquid and assumes some of the properties of a liquid. These properties are dependent upon the fluid composition, temperature, and pressure. As used herein, the "critical point" is the transition point at which the liquid and gaseous states of a substance merge with each other and represents the combination of the critical temperature and critical pressure for a given substance.

The compressibility of supercritical fluids is great just above the critical temperature where small changes in pressure result in large changes in the density of the supercritical fluid. The "liquid-like" behavior of a supercritical fluid at higher pressures results in greatly enhanced solubilizing capabilities compared to those of the "subcritical" compound, with higher diffusion coefficients and an extended useful temperature range compared to liquids. An interesting phenomenon associated with supercritical fluids is that as the pressure increases, the solubility of the solute often increases by many orders of magnitude with only a small pressure increase.

Near-supercritical liquids also demonstrate solubility characteristics and other pertinent properties similar to those of supercritical fluids. Fluid "modifiers" can often alter supercritical fluid properties significantly, even in relatively low concentrations. In one embodiment, a fluid modifier is added to the supercritical fluid. These variations are considered to be within the concept of a supercritical fluid as used in the context of this invention. Therefore, as used herein, the phrase "supercritical fluid" also denotes a compound above, at, or slightly below the critical temperature and pressure (the critical point) of that compound.

Examples of compounds which are known to have utility as supercritical fluids are given in Table 1.

TABLE 1

EXAMPLES OF SUPERCRITICAL FLUIDS

| Compound | Boiling Point (° C.) | Critical Temperature (° C.) | Critical Pressure (atm) | Critical Density (g/cm$^3$) |
|---|---|---|---|---|
| $CO_2$ | −78.5 | 31.3 | 72.9 | 0.448 |
| $NH_3$ | −33.35 | 132.4 | 112.5 | 0.235 |
| $H_2O$ | 100.00 | 374.15 | 218.3 | 0.315 |
| $N_2O$ | −88.56 | 36.5 | 71.7 | 0.45 |
| Xenon | −108.3 | 16.6 | 57.6 | 0.118 |
| Krypton | −153.2 | −63.8 | 54.3 | 0.091 |
| Methane | −164.00 | −82.1 | 45.8 | 0.2 |
| Ethane | −88.63 | 32.28 | 48.1 | 0.203 |
| Ethylene | −103.7 | 9.21 | 49.7 | 0.218 |
| Propane | −42.1 | 96.67 | 41.9 | 0.217 |
| Pentane | 36.1 | 196.6 | 33.3 | 0.232 |
| Methanol | 64.7 | 240.5 | 78.9 | 0.272 |
| Ethanol | 78.5 | 243.0 | 63.0 | 0.276 |
| Isopropanol | 82.5 | 235.3 | 47.0 | 0.273 |
| Isobutanol | 108.0 | 275.0 | 42.4 | 0.272 |
| $CClF_3$ | −31.2 | 28.0 | 38.7 | 0.579 |
| $CFH_3$ | −78.4 | 44.6 | 58.0 | 0.3 |
| Cyclohexanol | 155.65 | 356.0 | 38.0 | 0.273 |

Due to the low cost, environmental acceptability, non-flammability, and low critical temperature of carbon dioxide, nitrous oxide, and water, supercritical carbon dioxide, nitrous oxide and/or $H_2O$ fluid are preferably employed in the subject invention.

The supercritical fluid is contacted with the lens, the immersion space, and the wafer surface in any suitable manner. For example, the immersion space is flooded with the compound that forms the supercritical fluid (such as carbon dioxide) in liquid form. The pressure in the space is then increased above the critical pressure, followed by raising the temperature above the critical temperature, thereby converting the compound that forms the supercritical fluid into a supercritical fluid. Next, the pressure is decreased to ambient pressure and the temperature is lowered to room temperature. Alternatively, the immersion space is flooded with the compound that forms the supercritical fluid in liquid form, the pressure and temperature are raised simultaneously to the critical temperature and pressure ensuring that the liquid phase of the compound that forms the supercritical fluid remains in liquid form. Still alternatively, the supercritical fluid is formed just before being charged into the immersion space.

The supercritical fluid, after displacing defects, debris, and other unwanted material from the lens, the immersion space, and the wafer surface "evaporates", or otherwise is removed from the lens, the immersion space, and the wafer surface without causing any damage to the lens surface (such as scratching), the immersion space, or the wafer surface. The supercritical fluid and the contaminants on the lens, the immersion space, and the wafer surface are removed completely or at least substantially completely. Moreover, since the supercritical fluid is easily and completely removed from the lens, the immersion space, and the wafer surface, residual immersion liquid concerns on the lens, the immersion space, and the wafer surface are minimized and/or eliminated (or alternatively, there are inconsequentially small residual amounts). Since residual solvent concerns are minimized, problems such as increased cleaning of the lens, the immersion space, and the wafer surface are likewise minimized and/or eliminated. The supercritical fluid cleans the lens without damaging the lens (such as causing scratching or pits), cleans the immersion space without damaging the interior of the space, and cleans the wafer surface without changing any features on the wafer surface (such as etching a feature).

The supercritical fluid is in contact with the immersion lithography lens, the immersion space, and/or the wafer surface for a suitable period of time to remove at least substantially all contaminants therefrom. In one embodiment, the supercritical fluid is in contact with the immersion lithography lens, the immersion space, and/or the wafer surface for a time from about 0.1 seconds to about 10 minutes. In another embodiment, the supercritical fluid is in contact with the immersion lithography lens, the immersion space, and/or the wafer surface for a time from about 0.5 seconds to about 5 minutes. In yet another embodiment, the supercritical fluid is in contact with the immersion lithography lens, the immersion space, and/or the wafer surface for a time from about 1 second to about 1 minute.

In many instances, defects, debris, and other unwanted material from photoresists that accumulate on a lens, the immersion space, and/or the wafer surface are carbon based materials. Consequently, in one embodiment, one or more carbon containing supercritical fluids is contacted with the immersion lithography lens, the immersion space, and the wafer surface. Specific examples of carbon containing supercritical fluids include carbon dioxide, methane, ethane, ethylene, propane, pentane, methanol, ethanol, isopropanol, isobutanol, halocarbons, and cyclohexanol.

Figure 2:
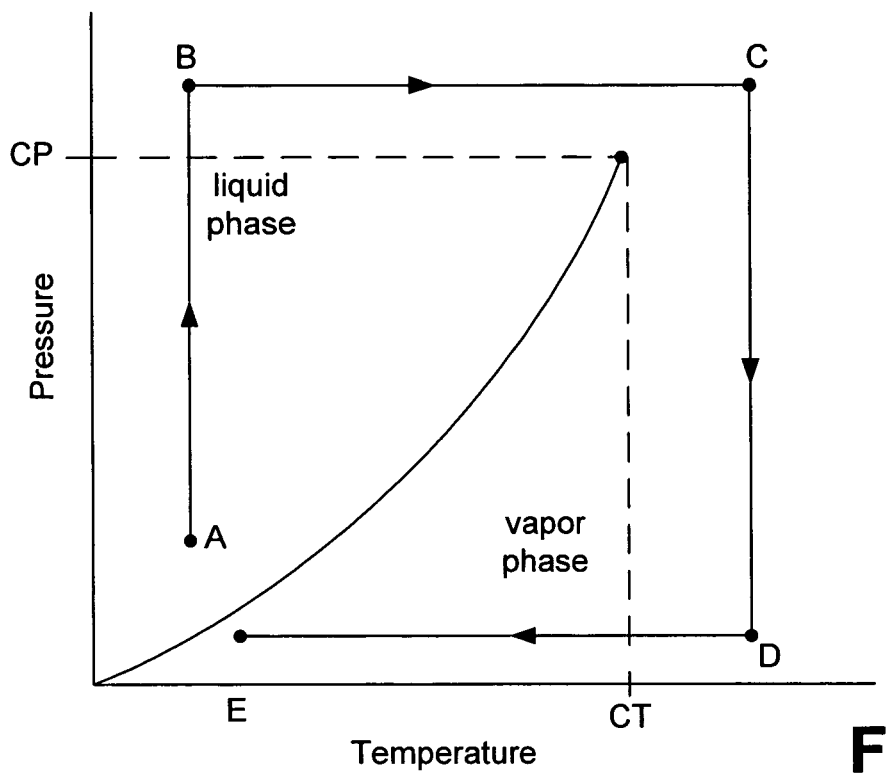
FIG. 2 shows a method of forming a supercritical fluid in the context of a phase diagram according to one aspect of the present invention.

One method of forming the supercritical fluid just before it enters the immersion space or in the immersion space is graphically illustrated in FIG. 2. FIG. 2 shows a phase diagram is shown with the pressure on the y-axis and the temperature on the x-axis. The critical temperature is represented by CT and the critical pressure is represented by CP. The line originating at the origin is the liquid-vapor interface. Point A refers to providing the compound that forms the supercritical fluid in liquid form (in the immersion space or in a chamber with a conduit to the immersion space). Increasing the pressure above the critical pressure is shown by the line from point A to point B; raising the temperature above the critical temperature is shown by the line from point B to point C; decreasing the pressure to ambient pressure is shown by the line from point C to point D; and decreasing the temperature to room temperature is shown by the line from point D to point E. Alternatively, any number of acts (a discrete pressure and temperature increase or decrease) may be employed, so long as the liquid-vapor interface line is not crossed.

Figure 3:
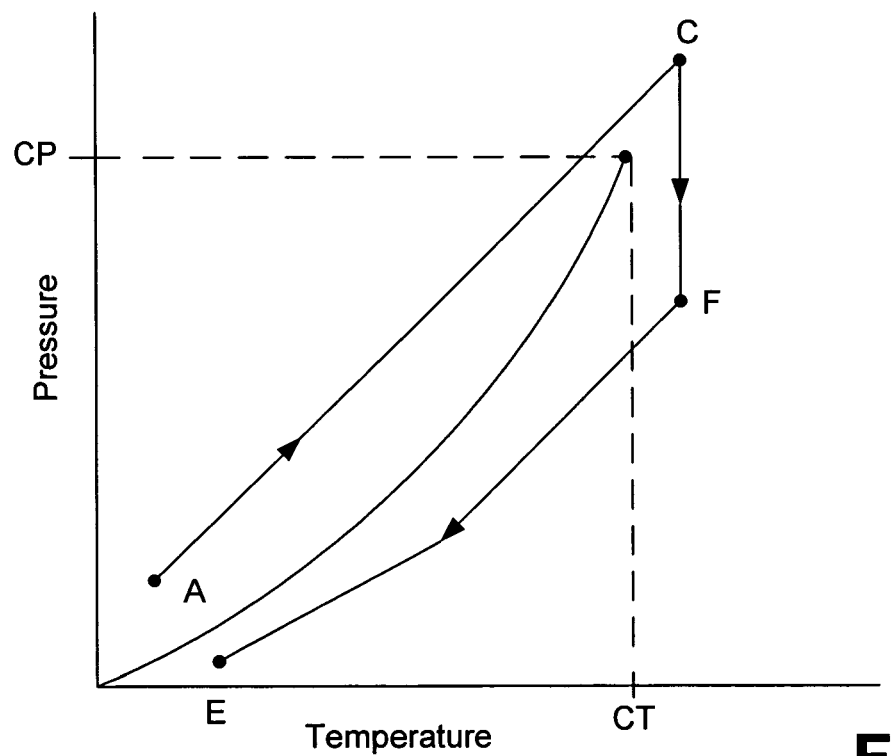
FIG. 3 shows another method of forming a supercritical fluid in the context of a phase diagram according to another aspect of the present invention.

Another method of forming the supercritical fluid just before it enters the immersion space or in the immersion space is graphically illustrated in FIG. 3. FIG. 3 shows a phase diagram is shown with the pressure on the y-axis and the temperature on the x-axis, wherein the critical temperature is represented by CT and the critical pressure is represented by CP, and the line originating at the origin is the liquid-vapor interface. Point A refers to providing the compound that forms the supercritical fluid in liquid form (in the immersion space or in a chamber with a conduit to the immersion space). Simultaneously increasing the pressure and temperature above the critical pressure is shown by the line from point A to point C; decreasing the pressure is shown by the line from point C to point F; and simultaneously decreasing the temperature to room temperature and ambient pressure is shown by the line from point F to point E.

Figure 4:
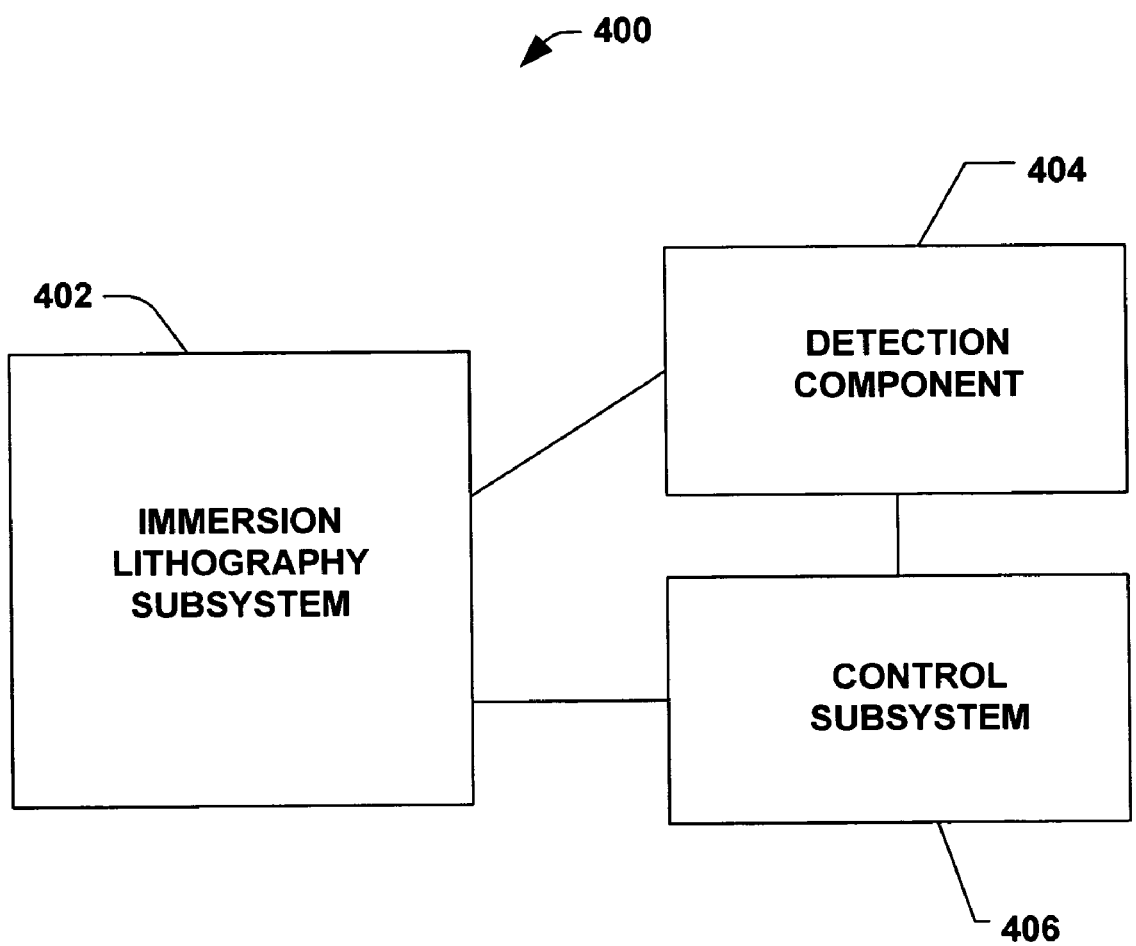
FIG. 4 is a schematic high level illustration of an immersion lithography system in accordance with another aspect of the subject invention.

Referring to FIG. 4, another system 400 and method according to an aspect of the subject invention are described. The system 400 includes an immersion lithography subsystem 402, a detection component 404, and a control subsystem 406. The immersion lithography subsystem 402 projects actinic radiation from an actinic radiation source through a lens and immersion liquid onto a wafer with a photoresist formed thereon. The immersion liquid occupies space between the lens and the photoresist of the wafer. Actinic radiation is projected to form an image-wise pattern on the photoresist. After development, the photoresist has a structural pattern analogous to the image-wise pattern of radiation (or a negative thereof).

The detection component 404 detects the need to clean lens, the immersion space, and/or the wafer surface due to photoresist species that diffuse into the immersion liquid or other contaminants and onto the lens, the immersion space, and/or the wafer surface. That is, the detection component 404 may detect debris on the lens, on the inner surface the immersion space, on the wafer surface, and/or in the immersion liquid. Once the need to clean any portion of the immersion lithography subsystem 402 is detected by the detection component 404, a control subsystem 406 directs removal of the immersion liquid from the immersion space and charges the immersion space with a supercritical fluid.

Optionally, the control subsystem 406 may dictate the amount of supercritical fluid that is charged into the immersion space, based in part on the amount or level of contamination detected on the lens, the immersion space, and/or the wafer surface. Further, the control subsystem 406 may dictate the time of contact between the supercritical fluid and the lens, the immersion space, and/or the wafer surface and/or any other parameter associated with cleaning the lens, the immersion space, and/or the wafer surface based in part on the amount or level of contamination detected by the detection component 404. The control subsystem 406 may initially direct cleaning of the lens, the immersion space, and/or the wafer surface based detected amounts of contaminants, or over time may recognize that a certain time interval is typically appropriate to clean the lens, the immersion space, and/or the wafer surface, based on accumulated data of past instances of supercritical fluid cleaning. After cleaning, the supercritical fluid is simply removed from the immersion lithography subsystem 402 and recycled or fresh immersion liquid is charged into the immersion space of the immersion lithography subsystem 402 so that additional immersion lithography operations can be conducted. The control subsystem 406 may operate by controlling the opening and closing of valves leading into and out of the immersion space, such as those valves described in FIG. 1.

The control subsystem 406 can be any device or combination of devices suitable to detect contamination of the lens, the immersion space, and/or the wafer surface or the likelihood of contamination on a lens. The lens may be inspected directly by optical, metrological, or chemical means, and/or the immersion liquid may be inspected by optical, metrological, or chemical means. For example, an optical device can detect the presence of contaminants on the lens surface and a chemical sensor can detect the presence of contaminants in the immersion liquid.

The control subsystem 406 may contain a processor and a memory, both of which are operably coupled to each other. It is to be understood that a that the processor can be a processor dedicated to determining whether contamination is present on/in the lens, the immersion space, and/or the wafer surface, how much contamination has accumulated on/in the lens, the immersion space, and/or the wafer surface, and/or whether the lens, the immersion space, and/or the wafer surface are substantially clean; a processor used to control one or more of the components or subcomponents of the subject system (such as valves); and/or, alternatively, a processor that is used to determine whether cleaning is necessary and to control one or more of the components of the immersion lithography subsystem 402. The memory subcomponent can be employed to retain lens, the immersion space, and/or the wafer surface contamination information, the identity and cleaning abilities of specific supercritical fluids and mixtures thereof, the number of immersion lithography operations conducted before/after cleaning a lens, the immersion space, and/or the wafer surface, and other related data, etc.

The detection component 404 relays information to the control subsystem 406, and the control subsystem 406 operates based on the content of the information (such as the presence of contaminants, the amount of contaminants, the number of immersion lithography operations, and the like).

The control subsystem 406 may employ various inference schemes and/or techniques in connection with cleaning the immersion lithography subsystem 402. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Simply speaking, the control subsystem 406 may employ inference schemes to automatically clean the immersion lithography subsystem 402 with a supercritical fluid when, based on past performance of immersion lithography operations, the lens, the immersion space, and/or the wafer surface has or is likely to have photoresist contaminants thereon.

The control subsystem 406 may contain a processor and receive data of pressure and temperature of the supercritical fluid or material that forms the supercritical fluid. The processor may be programmed to control and vary the pressure and temperature to form the supercritical fluid. A memory in the control subsystem 406 may serve as a storage medium for temporarily storing information such as pressure, temperature, critical pressure data, critical temperature data, temperature-pressure inter-relationship data, and other data which may be employed in forming the supercritical fluid or otherwise carrying out the subject invention. The control subsystem 406 may be coupled to the supercritical fluid source so as to maintain, raise, or lower the pressure and/or temperature of the supercritical fluid or the material that forms the supercritical fluid. Automated cleaning of the immersion lithography subsystem 402 is thereby enabled by this arrangement.

Figure 5:
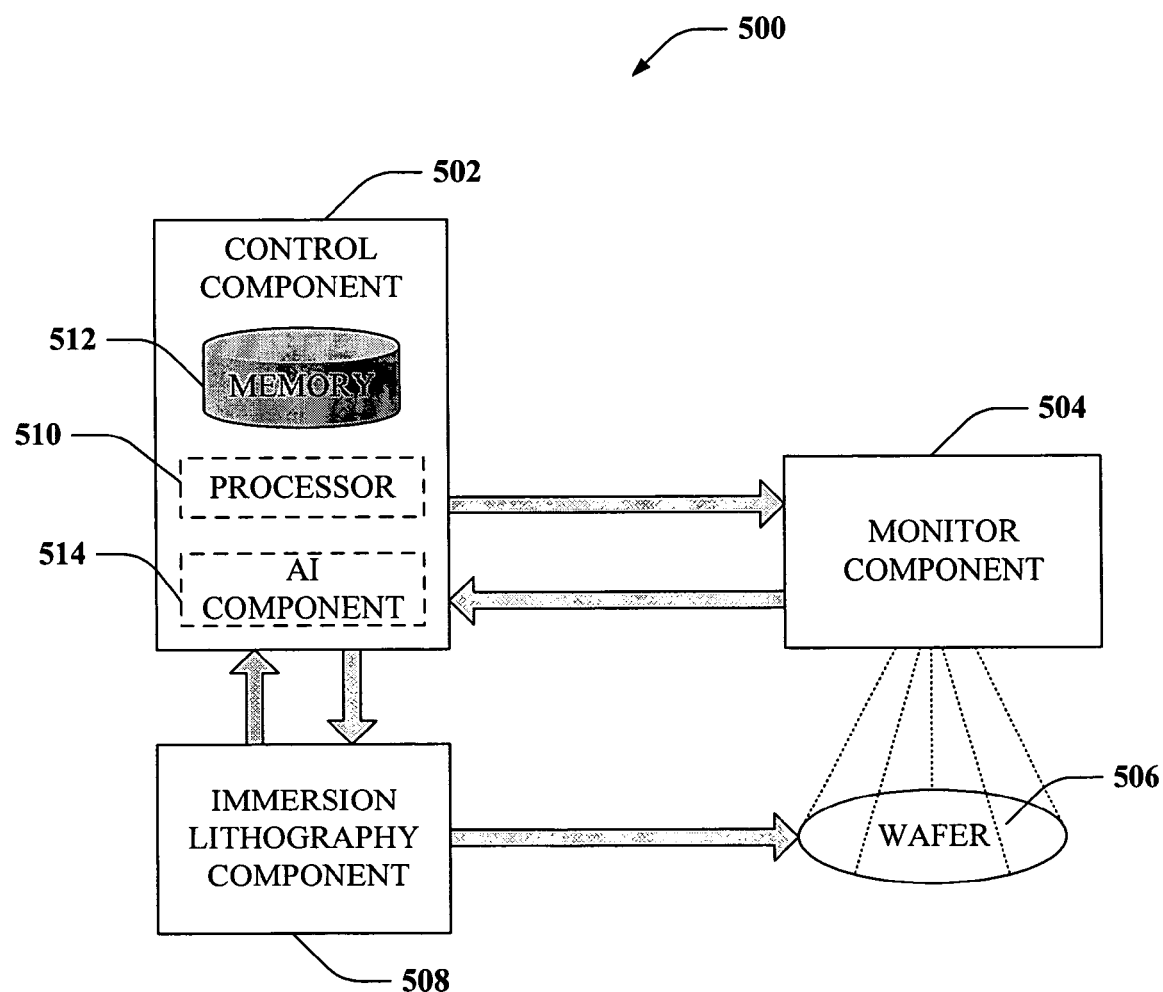
FIG. 5 is a schematic illustration of an immersion lithography system in accordance with yet another aspect of the subject invention.

FIG. 5 is an illustration of an immersion lithography self cleaning system 500 that facilitates detecting debris build-up on a lens, excess debris in the immersion liquid, and/or debris or staining on the wafer surface using a monitoring component, in accordance with an aspect of the invention. A control component 502 is operatively coupled to a monitor component 504 that can detect debris build-up on a lens of an immersion lithography component 508, excess debris in the immersion liquid, and/or debris or staining on a wafer 506. The control component 502 is operatively associated with the immersion lithography component 508 that performs immersion lithography on the resist on the wafer 506, and which can perform a self cleaning operation as instructed by the control component 502 based at least in part on information received from the monitor component 504. The control component 502 comprises a processor 510, and memory 512, and optionally an artificial intelligence (AI) component 514. The monitor component 504 can include one or more of a scatterometry system, an interferometry system, a reflectometry system, an optical system, and the like.

The optional AI component 514 can make inferences regarding whether and to what extent the immersion lithography self cleaning system should take compensatory action. For example, if the lens is determined to be partially covered with debris, the AI component 514 can make inferences regarding whether and to what extent to flush the lens and wafer with a supercritical fluid.

According to another example, the AI component 514 can determine that a particular region or regions on one or more wafers 506 induces a high rate of lens debris accumulation. In this scenario, the AI component 514 can infer that such information should be fed forward to facilitate instructing the immersion lithography component 508 to increase flushing with a supercritical fluid on such regions of subsequent wafers. The AI component 514 can additionally infer an appropriate adjustment to flush rates and/or duration of flush time for subsequent wafers and/or particular regions thereon. In this manner, the immersion lithography self cleaning system 500 can provide feed-forward information that can minimize delays associated with corrective action with regard to subsequent wafers.

Scatterometry, interferometry, and reflectometry are techniques for extracting information about a surface upon which incident light is directed. Information concerning properties including, but not limited to, debris presence, debris accumulation, profile, chemical composition, thickness of thin films and critical dimensions of features present on a surface such as a lens or wafer can be extracted. Furthermore, information about an immersion medium such as refractive index and lithographic constant can be extracted by utilizing scatterometry, interferometry, and reflectometry techniques. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light changes based on properties of the surface upon which the light is directed. Such properties include, but are not limited to, the chemical properties of the surface, the presence of debris on the surface, the planarity of the surface, features on the surface, voids in the surface, and the number, type of layers beneath the surface, refractive index of the surface, etc.

Different combinations of the above-mentioned properties have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the lens, immersion liquid, or wafer surface utilized in connection with a known grating structure on the surface. Such substantially unique phase/intensity signatures are produced by light reflected from and/or refracted by different surfaces and/or immersion liquids due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk$$

where j is the square root of (−1).

The signal (signature) library can be constructed from observed intensity/phase signatures and/or signatures generated by modeling and simulation. By way of illustration, when exposed to a first incident light of known intensity, wavelength and phase, a first feature on a lens or wafer or of an immersion liquid can generate a first phase/intensity signature. Similarly, when exposed to the first incident light of known intensity, wavelength and phase, a second feature on a lens or wafer or of an immersion liquid can generate a second phase/intensity signature. For example, no debris on a first portion of a lens may generate a first signature while some debris on a second portion of the lens may generate a second signature.

Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from the monitor component, the phase/intensity signals can be pattern matched, for example, to the library of signals, to determine whether the signals correspond to a stored signature. The subject invention contemplates any suitable monitor component and/or system, and such systems are intended to fall within the scope of the hereto-appended claims.

Figure 6:
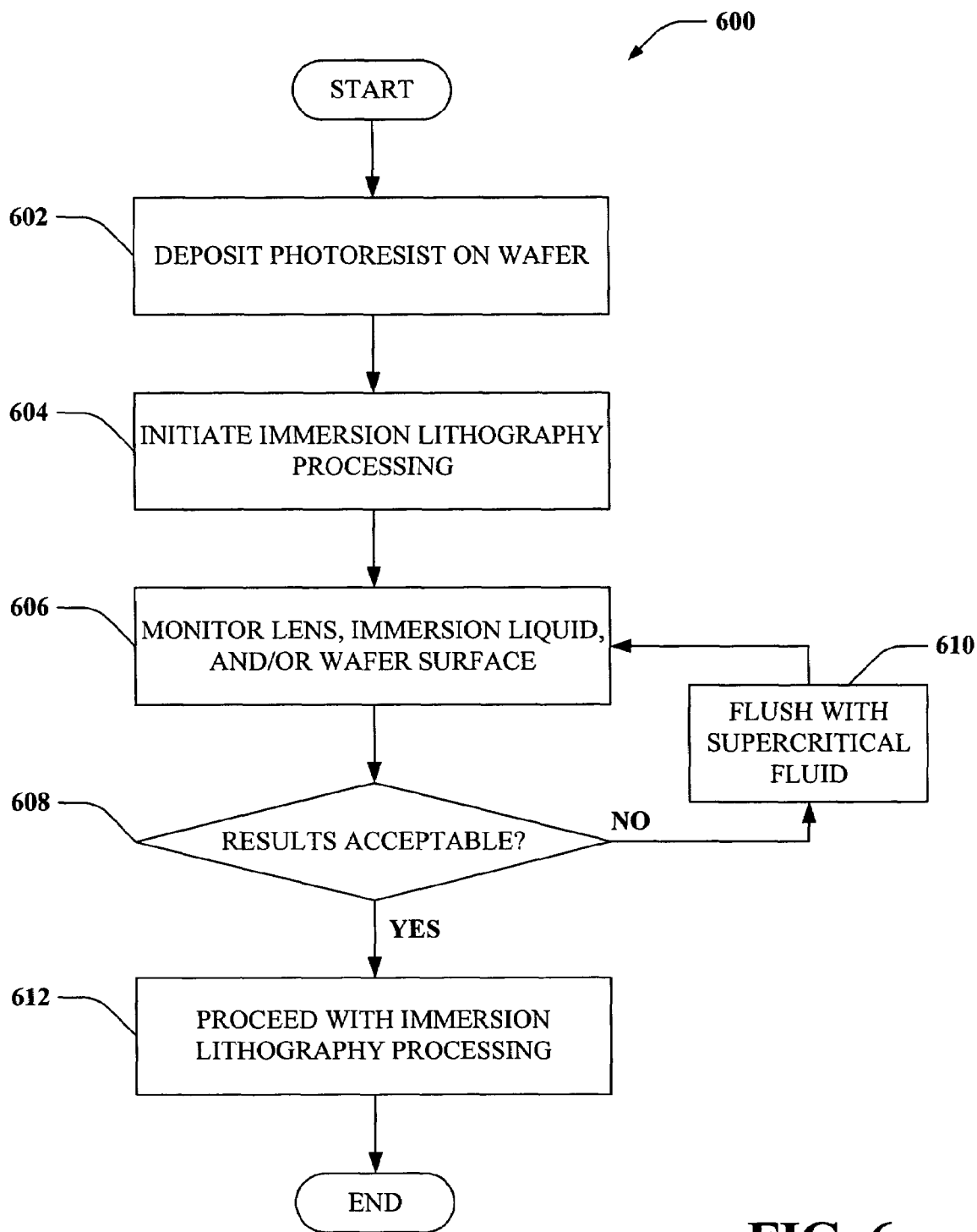
FIG. 6 shows an immersion lithography process according to an aspect of the subject invention.

FIG. 6 is an illustration of a methodology 600 for immersion lithography in accordance with an aspect of the subject invention. At 602, a photoresist can be formed on a wafer. At 604, immersion lithography processing is commenced, notably the photoresist can be irradiated through a lens adjacent an immersion liquid, the immersion liquid which is also adjacent the wafer surface. At 606, at least one of the lens, immersion liquid, and wafer are monitored using, for example, a scatterometry system an interferometry system, an optical system, or a reflectometry system. Monitoring at least one of the lens, immersion liquid, and wafer occurs before, during, and after the photoresist is irradiated, as desired by a user.

At 608, a determination can be made regarding the presence of debris on/in at least one of the lens, immersion liquid, and wafer. Such determination can be made, for instance, by comparing a detected signal from the lens, immersion liquid, or wafer to a predetermined desired signal from the lens, immersion liquid, or wafer. If the detected signal is close enough (meets or exceeds a threshold value) to the predetermined desired signal, then the method can proceed with immersion lithography processing at 612. According to one example, a predetermined tolerance for a predetermined desired signal can be provided.

If, at 608, it is determined that the detected signal is not close enough (does not meet a threshold value) to the predetermined desired signal, indicating the presence of debris on/in at least one of the lens, immersion liquid, and wafer, then the method can proceed to 610, where the space between the lens and wafer are flushed with a suitable amount of a supercritical fluid for a suitable amount of time to clean at least one of the lens, immersion liquid space, and wafer. Additionally, a region of the wafer can be determined to have a high incidence of debris presence, in which case flushing with a supercritical liquid can occur more often, or for a longer duration of time. Regions of a wafer can be defined, for example, by grid-mapping the wafer. Once flushing with a supercritical liquid is completed, the method can revert to 606 for continued inspection of at least one of the lens, immersion liquid, and wafer to facilitate a determination of whether cleaning with the supercritical liquid achieved target tolerances.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An immersion lithography method, comprising
   irradiating a photoresist through a lens and an immersion liquid of an immersion lithography tool, the immersion liquid in an immersion space contacting the lens and the photoresist;
   removing the immersion liquid from the immersion space;
   charging the immersion space with a supercritical fluid;
   removing the supercritical fluid from the immersion space; and
   charging the immersion space with immersion liquid.

2. The method of claim 1, wherein the supercritical fluid comprises at least one selected from the group consisting of ammonia, water, nitrous oxide, xenon, krypton, carbon dioxide, methane, ethane, ethylene, propane, pentane, methanol, ethanol, isopropanol, isobutanol, halocarbons, and cyclohexanol.

3. The method of claim 1, wherein the supercritical fluid comprises at least one carbon containing supercritical fluid.

4. The method of claim 1, wherein the supercritical fluid comprises carbon dioxide.

5. The method of claim 1, wherein irradiating a first photoresist comprises using one of 365 nm, 248 nm, 193 nm, 157 nm, 13 nm, and 11 nm wavelength radiation.

6. The method of claim 1, wherein the immersion liquid comprises at least one selected from the group consisting of purified water; deionized water; double deionized water; ionized water such as water containing phosphates, and water containing sulfates; cyclo-octane; perfluoropolyethers.

7. The method of claim 1, wherein the supercritical fluid occupies the immersion space for a time from about 0.1 seconds to about 10 minutes.

8. The method of claim 1, wherein the supercritical fluid has a critical temperature and critical pressure and is formed by providing a composition in a liquid phase in the second apparatus, and simultaneously raising the pressure of the composition above the critical pressure and the temperature above the critical temperature in the second apparatus.

9. An immersion lithography system, comprising
   a source of actinic radiation, a lens, an immersion liquid, and an immersion space for holding the immersion liquid in contact with the lens and in contact with a photoresist positioned on a wafer;
   a source of a supercritical fluid; and
   a valve system operable to remove the immersion liquid from the immersion space and fill the immersion space with the supercritical fluid and operable to remove the supercritical fluid from the immersion space and fill the immersion space with the immersion liquid.

10. The immersion lithography system of claim 9 further comprising a monitor component operable to detect debris on or in at least one of the lens, the immersion liquid, the immersion space, and the photoresist.

11. The immersion lithography system of claim 10 further comprising further comprising a control component operable to control the valve system to fill the immersion space with the supercritical fluid in response to the monitor component detecting debris.

12. The immersion lithography system of claim 11, the control component comprising a processor and memory and the monitor component comprising a scatterometry system, an interferometry system, a reflectometry system, or an optical system.

13. The immersion lithography system of claim 9, wherein the source of the supercritical fluid comprises at least one selected from the group consisting of ammonia, water, nitrous oxide, xenon, krypton, carbon dioxide, methane, ethane, ethylene, propane, pentane, methanol, ethanol, isopropanol, isobutanol, halocarbons, and cyclohexanol.

14. The immersion lithography system of claim 9, wherein the source of the supercritical fluid comprises carbon dioxide.

15. An immersion lithography method, comprising
irradiating a photoresist through a lens and an immersion liquid of an immersion lithography tool, the immersion liquid in an immersion space contacting the lens and the photoresist;
monitoring accumulation of debris on or in at least one of the lens, the immersion space, the immersion liquid, and the photoresist;
after debris are detected, removing the immersion liquid from the immersion space;
charging the immersion space with a supercritical fluid;
removing the supercritical fluid from the immersion space; and
charging the immersion space with immersion liquid.

16. The method of claim 15, wherein the supercritical fluid comprises at least one selected from the group consisting of ammonia, water, nitrous oxide, xenon, krypton, carbon dioxide, methane, ethane, ethylene, propane, pentane, methanol, ethanol, isopropanol, isobutanol, halocarbons, and cyclohexanol.

17. The method of claim 15, wherein a monitor component detects debris, and a control component initiates charging the immersion space with the supercritical fluid.

18. The method of claim 15, wherein a processor directs formation of the supercritical fluid by controlling temperature and pressure.

19. The method of claim 15, wherein debris are detected based on historical data of previous immersion lithography operations.

20. The method of claim 15, wherein the supercritical fluid occupies the immersion space for a time from about 0.1 seconds to about 10 minutes.

* * * * *